United States Patent
Zhang et al.

(10) Patent No.: US 11,798,982 B2
(45) Date of Patent: Oct. 24, 2023

(54) SELF-ALIGNED TRENCH MOSFET

(71) Applicant: Applied Materials, Inc., Santa Clara, CA (US)

(72) Inventors: Qintao Zhang, Mt Kisco, NY (US); Samphy Hong, Saratoga Springs, NY (US); Jason Appell, Albany, NY (US); David J. Lee, Poughkeepsie, NY (US)

(73) Assignee: Applied Materials, Inc., Santa Clara, CA (US)

( * ) Notice: Subject to any disclaimer, the term of this patent is extended or adjusted under 35 U.S.C. 154(b) by 250 days.

(21) Appl. No.: 17/238,504

(22) Filed: Apr. 23, 2021

(65) Prior Publication Data

US 2022/0344453 A1    Oct. 27, 2022

(51) Int. Cl.
| | |
|---|---|
| H01L 21/04 | (2006.01) |
| H01L 29/06 | (2006.01) |
| H01L 29/16 | (2006.01) |
| H01L 29/10 | (2006.01) |
| H01L 29/66 | (2006.01) |
| H01L 21/76 | (2006.01) |
| H01L 21/761 | (2006.01) |
| H01L 29/78 | (2006.01) |

(52) U.S. Cl.
CPC ........ *H01L 29/063* (2013.01); *H01L 21/0465* (2013.01); *H01L 21/761* (2013.01); *H01L 21/7602* (2013.01); *H01L 29/1095* (2013.01); *H01L 29/1608* (2013.01); *H01L 29/66068* (2013.01); *H01L 29/7813* (2013.01)

(58) Field of Classification Search
CPC . H01L 21/0465; H01L 21/04; H01L 21/7602; H01L 21/761; H01L 21/76; H01L 29/063; H01L 29/0623; H01L 29/06; H01L 29/1095; H01L 29/10; H01L 29/1608; H01L 29/41766; H01L 29/41; H01L 29/66068; H01L 29/66; H01L 29/7813; H01L 29/78
USPC .......................................................... 257/77
See application file for complete search history.

(56) References Cited

U.S. PATENT DOCUMENTS

| | | | |
|---|---|---|---|
| 2020/0312979 A1* | 10/2020 | Siemieniec | ......... H01L 29/7813 |
| 2021/0020740 A1* | 1/2021 | Siemieniec | ........... H01L 21/049 |
| 2022/0149196 A1* | 5/2022 | Kim | .................... H01L 29/8083 |

OTHER PUBLICATIONS

O. Seek, et al., "Double p-base structure for 1.2-kV SiC trench MOSFETs with the suppression of electric-field crowding at gate oxide," Microelectronic Engineering, 225 (2020) 111280, 4 pages.

* cited by examiner

*Primary Examiner* — Fazli Erdem
(74) *Attorney, Agent, or Firm* — KDW Firm PLLC

(57) ABSTRACT

Methods may include providing a device structure including a well formed in an epitaxial layer, and forming a plurality of shielding layers in the device structure, wherein at least one shielding layer is formed between a pair of adjacent sacrificial gates of a plurality of sacrificial gates. The method may further include forming a contact over the at least one shielding layer, forming a fill layer over the contact, and forming a plurality of trenches into the device structure, wherein at least one trench of the plurality of trenches is formed between a pair of adjacent shielding layers of the plurality of shielding layers, and wherein the at least one trench of the plurality of trenches is defined in part by a sidewall of the fill layer. The method may further include forming a gate structure within the at least one trench of the plurality of trenches.

18 Claims, 7 Drawing Sheets

SELF-ALIGNED TRENCH MOSFET

FIELD OF THE DISCLOSURE

The present embodiments relate to semiconductor device patterning, and more particularly, to self-aligned trench MOSFETs to enable advanced device scaling.

BACKGROUND OF THE DISCLOSURE

Low voltage power metal-oxide-semiconductor field-effect transistors (MOSFETs) are often used in load switching applications where reduction of the on-resistance ($R_{ds}$) of the device is desirable. In some applications, the $R_{ds}A$ of the device is minimized, where $R_{ds}A$ is the on-resistance of the device multiplied by the active area of the device. Additionally, low voltage power MOSFETs are commonly used in high frequency DC-DC applications.

Trench MOSFET scaling to improve device performance is a continuous goal. In one prior approach, a well implant is performed before trench etching. However, this lithography defined approach results in inaccurate alignment of gate shielding while allowing one channel for each trench pitch. In another prior approach, a gate shielding implant is performed through the source trench. Although this approach results in trench-defined gate shielding self-alignment, two channels are provided for every three trench pitches, which results in poor scalability.

Accordingly, improved trench formation approaches are needed to maximize scalability.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a device structure including a well formed in an epitaxial layer, forming a plurality of shielding layers in the device structure, wherein at least one shielding layer of the plurality of shielding layers is formed between a pair of adjacent sacrificial gates of a plurality of sacrificial gates formed atop the well and the epitaxial layer, and forming a contact over the at least one shielding layer. The method may further include forming a fill layer over the contact, and forming a plurality of trenches into the device structure, wherein at least one trench of the plurality of trenches is formed between a pair of adjacent shielding layers of the plurality of shielding layers, and wherein the at least one trench of the plurality of trenches is defined in part by a sidewall of the fill layer. The method may further include forming a gate structure within the at least one trench of the plurality of trenches.

In another aspect, a metal-oxide-semiconductor field-effect transistor (MOSFET), may include a device structure having a well formed in an epitaxial layer and a source layer atop the well. The MOSFET may further include a plurality of gate structures, wherein a first gate structure of the plurality of gate structures is formed within a first trench of the device structure, and wherein a second gate structure of the plurality of gate structures is formed within a second trench of the device structure. The MOSFET may further include a plurality of shielding layers extending through the device structure, wherein a first shielding layer of the plurality of shielding layers is formed between the first trench and the second trench.

In yet another aspect, a method of forming a self-aligned trench MOSFET may include providing a device structure comprising a well formed in an epitaxial layer and a source layer atop the well, patterning a plurality of openings through a sacrificial gate material layer, and forming a first shielding layer and a second shielding layer through the device structure. The first shielding layer may be formed through a first opening of the plurality of openings of the sacrificial gate material layer, and the second shielding layer may be formed through a second opening of the plurality of openings of the sacrificial gate material layer. The method may further include forming a first contact over the first shielding layer and a second contact over the second shielding layer, forming a fill layer in the first and second openings of the plurality of openings of the sacrificial gate material, wherein the fill layer is formed atop the first and second contacts, forming a plurality of trenches through the device structure, wherein at least one trench of the plurality of trenches is formed between the first shielding layer and the second shielding layer, and forming a gate structure within the at least one trench of the plurality of trenches.

BRIEF DESCRIPTION OF THE DRAWINGS

The accompanying drawings illustrate exemplary approaches of the disclosure, including the practical application of the principles thereof, as follows.

Figure 1:
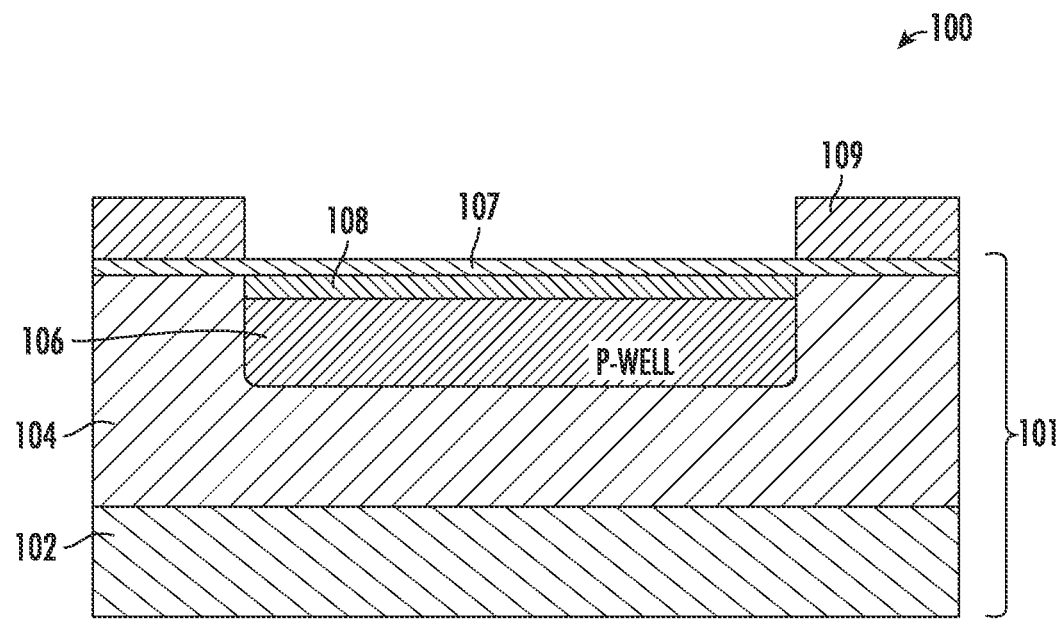
FIG. 1 is a cross-sectional side view of a device structure including a well formed in an epitaxial layer, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art Embodiments described herein advantageously provide self-aligned trenches for MOSFET devices. In some embodiments, a plurality of shielding layers are formed in a device structure including a well (e.g., P-well) formed in an epitaxial layer (e.g., SiC epitaxial material), wherein each of the shielding layers is formed by an ion implant delivered into the device structure between a pair of adjacent sacrificial gates, which are formed atop the device structure. As a result, a lateral position of the gate shielding implant is more precisely controlled. Trenches may then be formed through the device structure using a patterned fill layer (e.g., oxide) to guide lateral etch dimensions. The self-aligned distance between the gate shielding layers and gate trenches advantageously reduces high gate breakdown and improves channel performance uniformity. In some embodiments, two channels may be formed in each trench pitch, which leads to greater scalability.

FIG. 1 is a side cross-sectional view of a semiconductor device structure (hereinafter "device") 100, such as a MOSFET, according to one or more embodiments described herein. The device 100 may include a device structure 101 having a substrate 102, an epitaxial layer 104, a well 106, and a source region or layer 108. The well 106 and the source layer 108 may be formed through one or more masks, such as a first hardmask 107 and a second hardmask 109. Although non-limiting, the epitaxial layer 104 may be a silicon carbide (SiC) n-type drift layer, the well 106 may be a p-type well, and the source layer 108 may be an N+ source layer. In other embodiments, the source layer 108 may include N+ and P+ regions next to each other, wherein P+ serves as a P-well contact and N+ serves as the source layer. Shown as a single layer, the epitaxial layer 104 may include multiple layers in other embodiments. As known, the well 106 may be formed using a plurality of doping steps or epitaxy steps.

Figure 2:
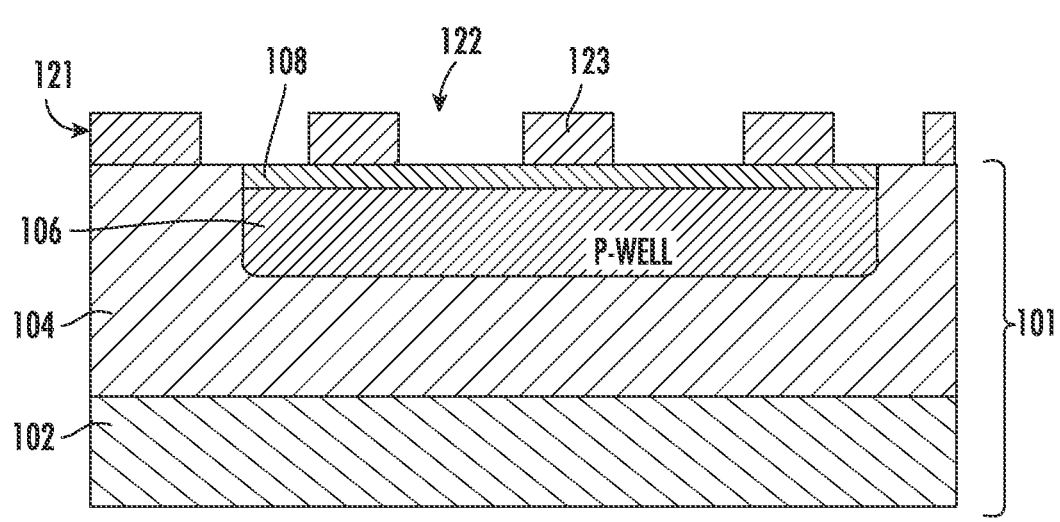
FIG. 2 is a side cross-sectional view illustrating the device structure following patterning of a sacrificial gate material layer, according to embodiments of the present disclosure.

As shown in FIG. 2, a sacrificial gate material layer 121 may be formed atop the device structure 101, and then patterned (e.g., etched) to form a plurality of openings 122 and a plurality of sacrificial gate structures 123. In some embodiments, the sacrificial gate material layer 121 may be polysilicon formed using a low-pressure chemical vapor deposition (LPCVD) process.

Figure 3:
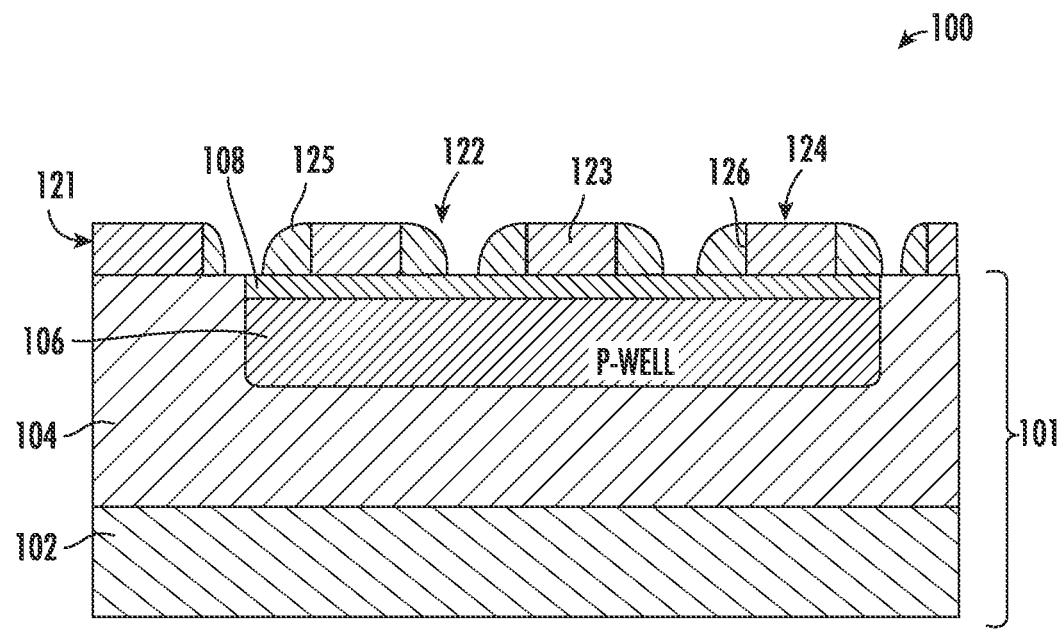
FIG. 3 is a side cross-sectional view illustrating the device structure following formation of a plurality of sacrificial gates, according to embodiments of the present disclosure.

As shown in FIG. 3, a plurality of sacrificial gates 124 are formed over the device structure 101. More specifically, one or more spacers 125 may be formed along a sidewall 126 of each of the sacrificial gate structures 123. In some embodiments, the spacers 125 are formed directly atop the source layer 108.

Figure 4:
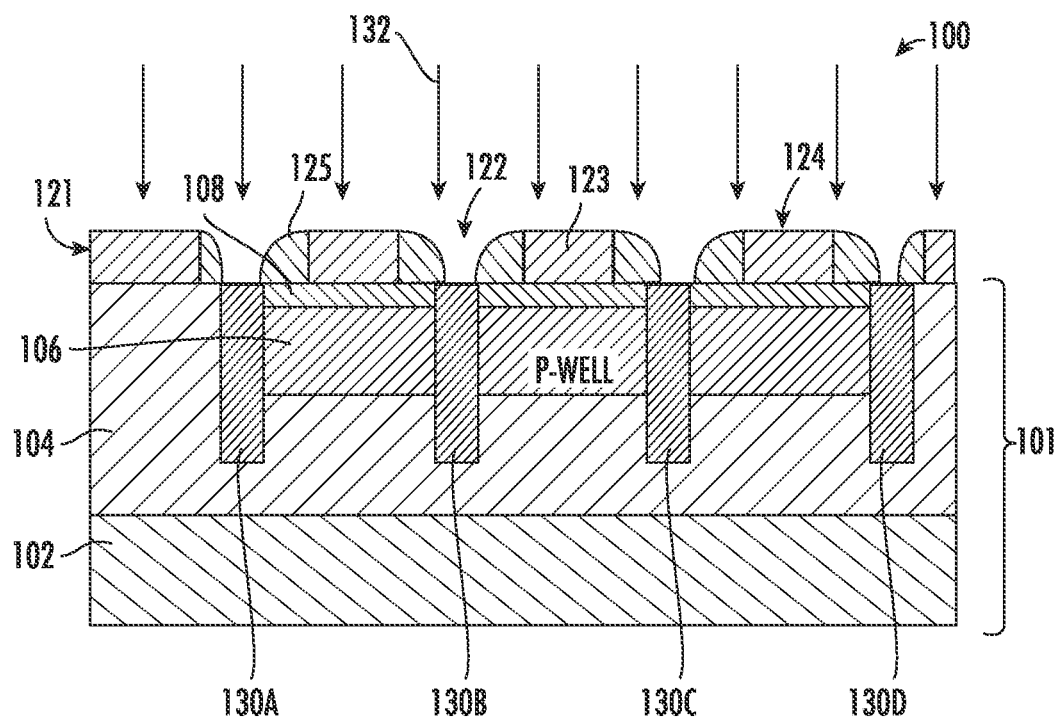
FIG. 4 is a side cross-sectional view illustrating the device structure following formation of a plurality of shielding layers, according to embodiments of the present disclosure.

As shown in FIG. 4, a plurality of shielding layers 130A-130D are formed in the device structure 101. More specifically, an ion implant 132 (e.g., P-shielding doping) may be delivered into the epitaxial layer 104, the well 106, and the source layer 108. In some embodiments, the ion implant 132 may be a high temperature (e.g., 350° C. to 1000° C.) aluminum implant delivered at a desired energy, such as an energy from 10 KeV to 3.5 MeV. As shown, the shielding layers 130A-130D are formed between the sacrificial gates 124. Advantageously, the spacers 125 act as a self-aligned hardmask for the ion implant 132. Although non-limiting, shielding layers 130B, 130C may be formed through a central area of the well 106, and shielding layers 130A, 130D may be formed at opposite outer edges of the well 106.

Figure 5:
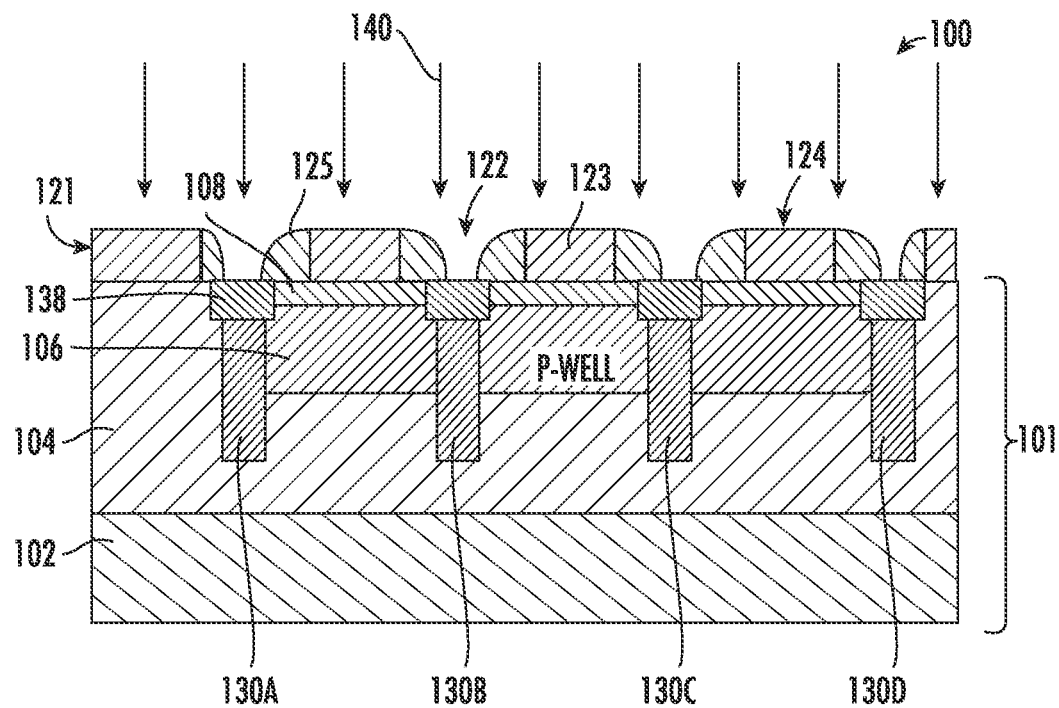
FIG. 5 is a side cross-sectional view illustrating the device structure following formation of a set of contacts, according to embodiments of the present disclosure.

As shown in FIG. 5, a set of contacts 138 may be formed over each of the shielding layers 130A-130D. In some embodiments, the contacts 138 may be formed using a second ion implant 140 (e.g., Al) delivered into the device structure 101 at a medium energy (e.g., from 10 KeV to 1 MeV). The spacers 125 may similarly act as a self-aligned hardmask for the second ion implant 140.

Figure 6:
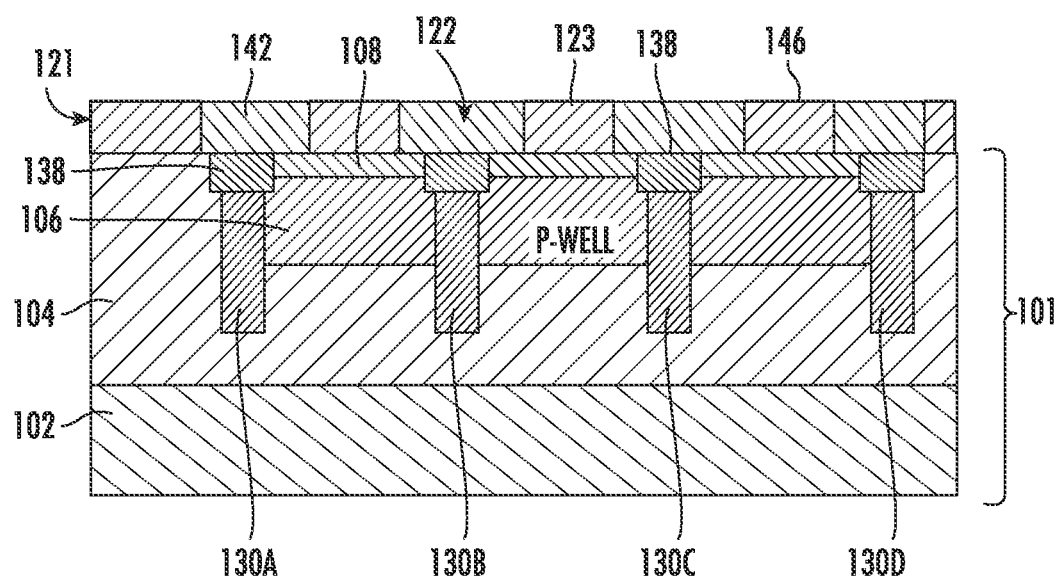
FIG. 6 is a side cross-sectional view illustrating the device structure following formation of a fill layer over the contacts, according to embodiments of the present disclosure.

As shown in FIG. 6, the spacers 125 may be removed (e.g., etched) from the sacrificial gate structures 123, and a fill layer 142 may be formed over the contacts 138. In some embodiments, the fill layer 142 may be an oxide, which is deposited into the plurality of openings 122 and then planarized selective to a top surface 146 of the sacrificial gate structures 123. As shown, portions of the fill layer 142 may be formed directly atop the contacts 138 and the source layer 108.

Figure 7:
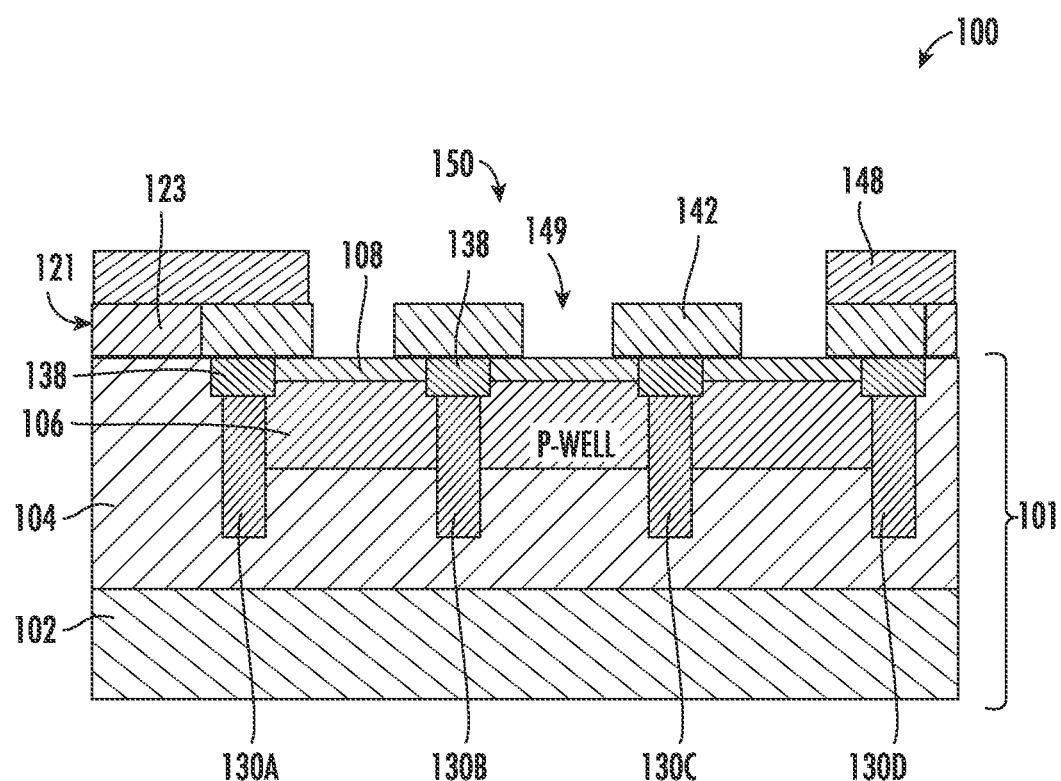
FIG. 7 is a side cross-sectional view illustrating the device structure following formation of a mask, according to embodiments of the present disclosure.

As shown in FIG. 7, a mask 148 may be formed over the device structure 101, e.g., atop the fill layer 142 and the sacrificial gate structures 123. An opening 150 may be formed through the mask 148, and the exposed sacrificial gate structures 123 may be removed, e.g., a using polysilicon pull process, to form a plurality of openings 149 in the fill layer 142. As shown, the sacrificial gate structures 123 are removed selective to the source layer 108 without removing the fill layer 142.

Figure 8:
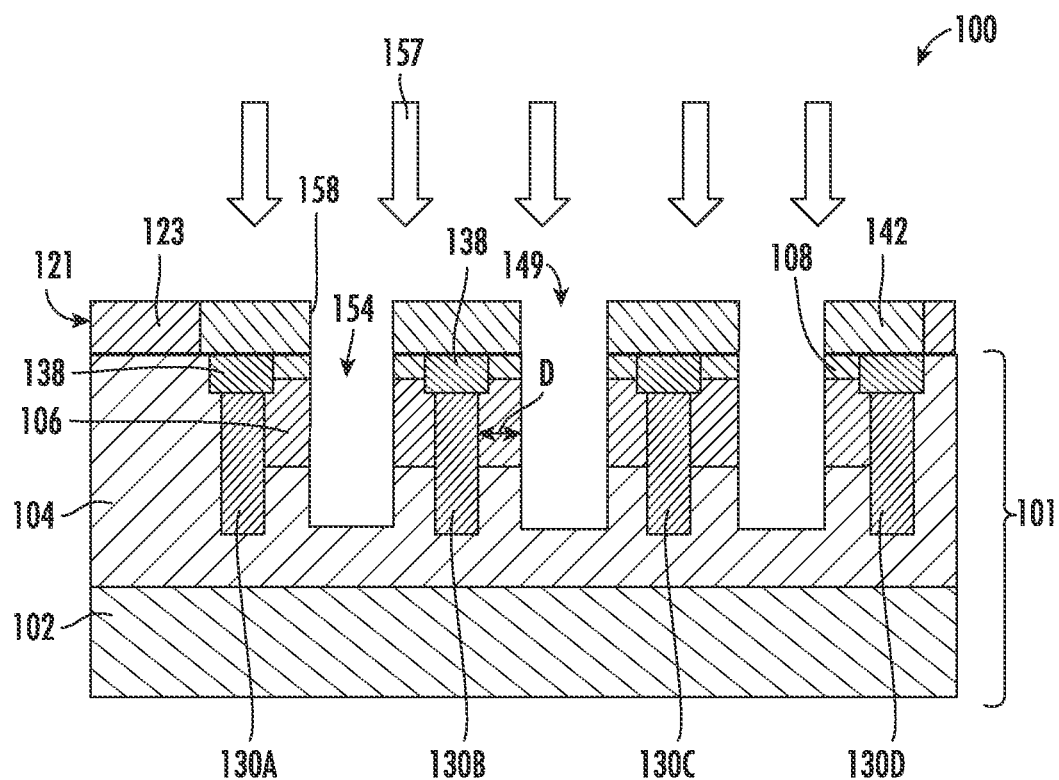
FIG. 8 is a side cross-sectional view illustrating the device structure following formation of a plurality of trenches, according to embodiments of the present disclosure.

As shown in FIG. 8, a plurality of trenches 154 may be formed through the device structure 101, including through the epitaxial layer 104, the well 106, and the source layer 108. As shown, the trenches 154 are formed through the plurality of openings 149 of the fill layer 142 using an etch process 157. The trenches 154 may be defined in part by a sidewall 158 of the fill layer 142. As a result, a distance 'D' between each shielding layer 130A-130D and corresponding adjacent trenches 154 is self-aligned and consistent.

Figure 9:
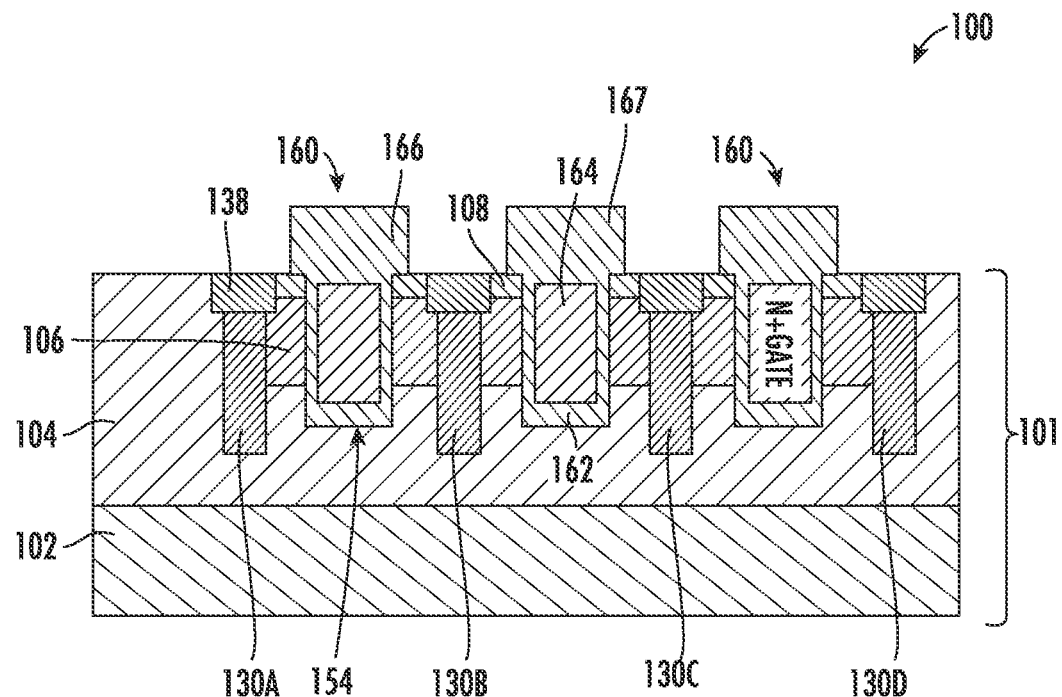
FIG. 9 is a side cross-sectional view illustrating the device structure following formation of a plurality of gate structures, according to embodiments of the present disclosure.

As shown in FIG. 9, a plurality of gate structures 160 (e.g., N+ gates) may be formed within each of the trenches 154. In some embodiments, forming the gate structures 160 may include removing any remaining sacrificial oxide and then annealing the device structure 101 to form rounded corners within the trenches 154. In some embodiments, the anneal may be a hydrogen anneal. Formation of the gate structures 160 may further include deposition of a gate oxide 162, wherein the gate oxide 162 may be formed by a thermal oxidation process or LPCVD deposition process to form a uniform-thickness oxide or thicker on trench bottom along the surfaces of the trenches 154. A gate material 164 may be formed over the device structure 101 including atop the gate oxide 162 within the trenches 154. In some embodiments, the gate material 164 may be a polysilicon gate refill deposited and then planarized (e.g., via CMP) or etched back. Although non-limiting, in various embodiments, the gate material 164 may be a p-type or n-type polysilicon, which is doped. An oxide fill 166 may then be formed over the gate material 164, followed by formation of an interlayer dielectric (ILD) 167, and lithography to open the source areas.

Figure 10:
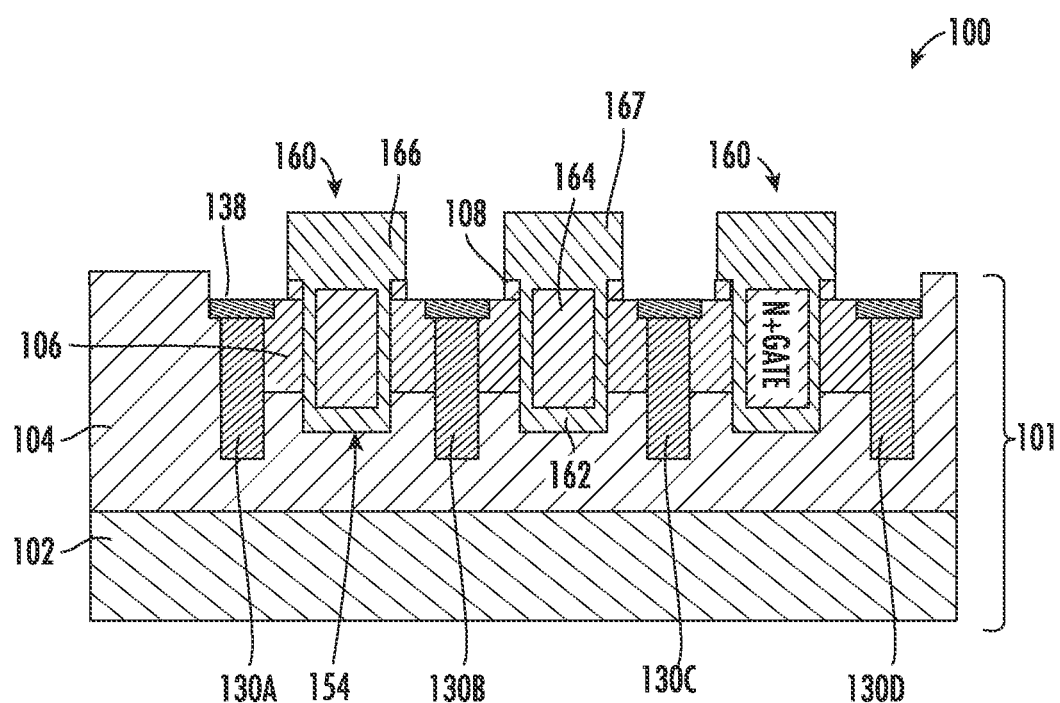
FIG. 10 is a side cross-sectional view illustrating the device structure following recessing of the contacts, according to embodiments of the present disclosure.
Figure 11:
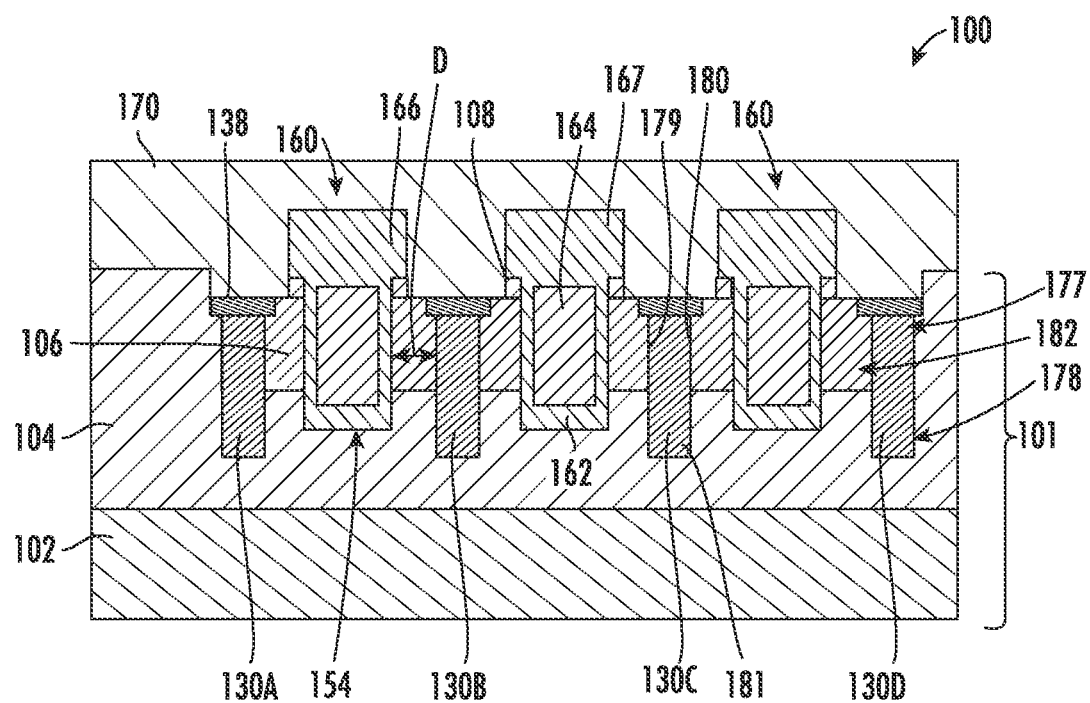
FIG. 11 is a side cross-sectional view illustrating the device structure following formation of a metal fill, according to embodiments of the present disclosure.

The contacts 138 may then be recessed, as shown in FIG. 10, and a metal fill 170 may be formed over the device structure 101, as shown in FIG. 11. In some embodiments, the metal fill 170 may be formed directly atop the contacts 138. As demonstrated, the device 100 provides a self-aligned distance 'D' between each shielding layer 130A-130D and the gate structures 160. The distance may remain substantially constant between an upper portion 177 and a bottom portion 178 of each shielding layer 130A-130D. Said another way, the shielding layers 130A-130D may extend vertically within the device structure 101, parallel to the trenches 154. In some embodiments, each shielding layer 130A-130D may be defined by a first sidewall 179, a second sidewall 180, and a bottom wall 181 connected to the first and second sidewalls 179, 180. The first and second sidewalls 179, 180 may be directly surrounded by the well 106 and the epitaxial layer 104, while the bottom wall 181 may be directly surrounded by the epitaxial layer 104. As a result, the shielding layers 130A-130D are separated/isolated from each trench 154 and gate structure 160 by portions 182 of the device structure 101.

Figure 12:
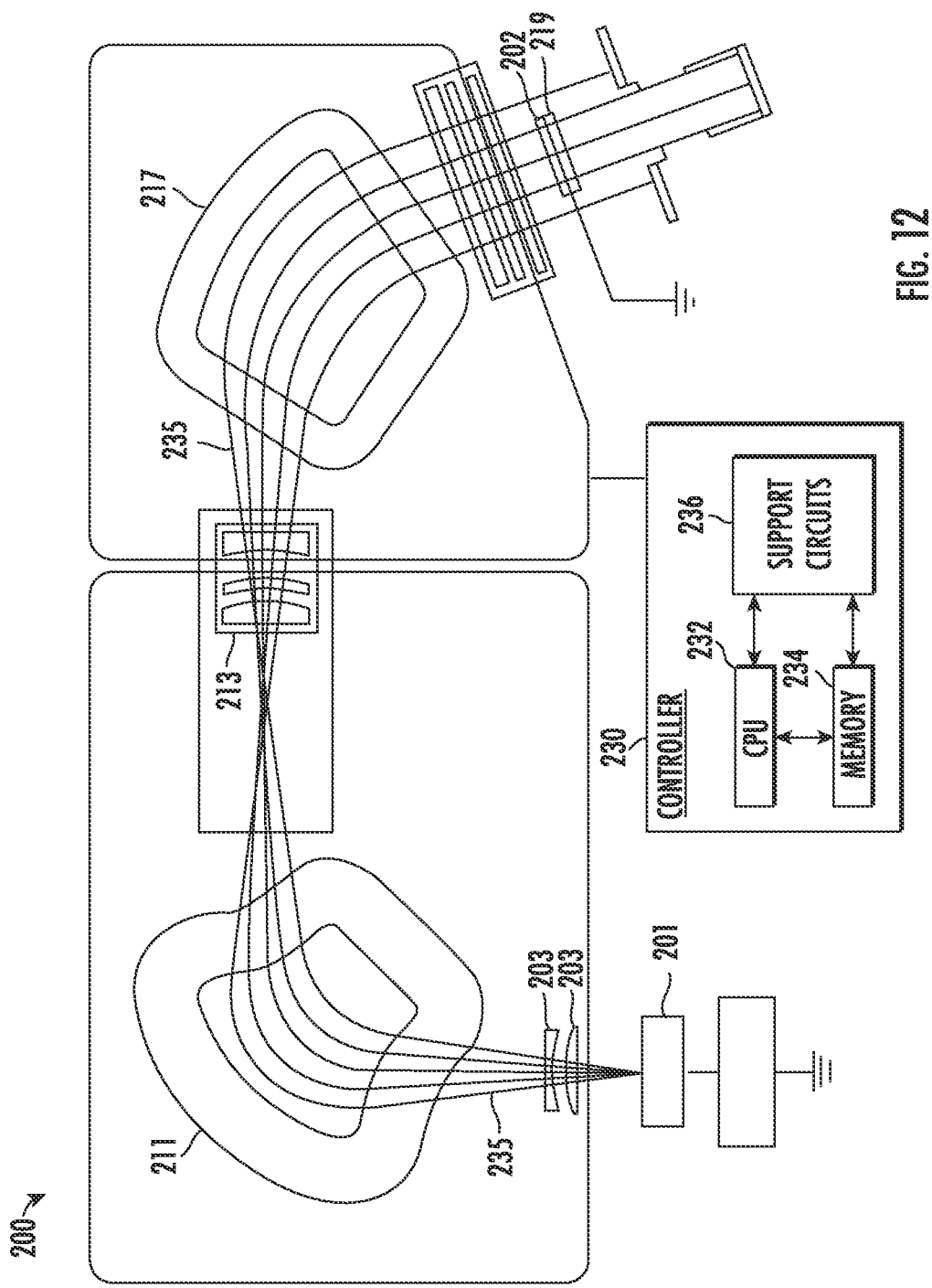
FIG. 12 illustrates a schematic diagram of a processing apparatus according to embodiments of the present disclosure.

FIG. 12 illustrates a schematic diagram of a processing apparatus 200 useful to perform processes described herein. The processing apparatus 200 may include an ion source 201 for generating ions. For example, the ion source 201 may provide an ion implant, such as the ion implant 132 shown in FIG. 4 or the second ion implant 140 shown in FIG. 5. The ion source 201 may also provide an ion etch, such as the etch process 157 of FIG. 8. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
  providing a device structure comprising a well formed in an epitaxial layer;
  forming a plurality of sacrificial gates over the device structure, wherein a sacrificial gate material of a pair of adjacent sacrificial gates of the plurality of sacrificial gates is formed over the well;
  forming a plurality of shielding layers in the device structure, wherein at least one shielding layer of the plurality of shielding layers is formed between the pair of adjacent sacrificial gates of the plurality of sacrificial gates;
  forming a contact over the at least one shielding layer;
  forming a fill layer over the contact;
  forming a plurality of trenches into the device structure, wherein at least one trench of the plurality of trenches is formed between a pair of adjacent shielding layers of the plurality of shielding layers, and wherein the at least one trench of the plurality of trenches is defined in part by a sidewall of the fill layer; and
  forming a gate structure within the at least one trench of the plurality of trenches.

2. The method of claim 1, further comprising forming the plurality of sacrificial gates by:
  patterning a plurality of openings through a sacrificial gate material layer, the sacrificial gate material layer formed atop the epitaxial layer and a source layer over the well; and
  forming a spacer along the sacrificial gate material layer within each of the plurality of openings of the sacrificial gate material layer.

3. The method of claim 2, wherein forming the plurality of shielding layers comprises performing an ion implant into the well and the epitaxial layer.

4. The method of claim 3, wherein performing the ion implant comprises implanting aluminum ions into the device structure through the plurality of openings of the sacrificial gate material layer.

5. The method of claim 2, further comprising removing the spacer from the plurality of openings of the sacrificial gate material layer, wherein the fill layer is formed within the plurality of openings of the sacrificial gate material layer after the spacer is removed.

6. The method of claim 5, further comprising:
providing a mask over the device structure;
forming an opening though the mask; and
removing a portion of the sacrificial gate material layer exposed through the opening of the mask without removing the fill layer.

7. The method of claim 6, wherein the plurality of trenches are formed through the well and the epitaxial layer after the portion of the sacrificial gate material layer is removed.

8. The method of claim 1, further comprising recessing the contact after the gate structure is formed.

9. The method of claim 8, further comprising forming a metal fill over the device structure after the contact is recessed.

10. A metal-oxide semiconductor field-effect transistor (MOSFET), comprising:
a device structure, comprising:
a well formed in an epitaxial layer; and
a source layer atop the well;
a plurality of gate structures, wherein a first gate structure of the plurality of gate structures is formed within a first trench of the device structure, and wherein a second gate structure of the plurality of gate structures is formed within a second trench of the device structure; and
a plurality of shielding layers extending through the device structure, wherein a first shielding layer of the plurality of shielding layers is formed between the first trench and the second trench, wherein the first shielding layer is defined by a first sidewall opposite a second sidewall, and wherein the first sidewall and the second sidewall are separated from the first trench and the second trench by the well and the epitaxial layer.

11. The MOSFET of claim 10, further comprising:
a first contact over the first shielding layer and a second contact over a second shielding layer; and
a fill layer formed over the first and second contacts.

12. The MOSFET of claim 10, wherein the well is a P-well, the epitaxial layer is silicon carbide, and the source layer is an N+ source layer.

13. The MOSFET of claim 10, wherein the plurality of shielding layers extend parallel to the first trench and to the second trench.

14. The MOSFET of claim 10, wherein the first shielding layer further comprises a bottom wall connected to the first sidewall and the second sidewall, wherein the bottom wall is surrounded by the epitaxial layer.

15. A method of forming a self-aligned trench metal-oxide-semiconductor field-effect transistor (MOSFET), comprising:
providing a device structure comprising a well formed in an epitaxial layer and a source layer atop the well;
patterning a plurality of openings through a sacrificial gate material layer;
forming a first shielding layer and a second shielding layer through the device structure, wherein the first shielding layer is formed through a first opening of the plurality of openings of the sacrificial gate material layer, and wherein the second shielding layer is formed through a second opening of the plurality of openings of the sacrificial gate material layer;
forming a first contact over the first shielding layer and a second contact over the second shielding layer;
removing a spacer from the first and second openings of the plurality of openings of the sacrificial gate material layer;
forming a fill layer in the first and second openings of the plurality of openings of the sacrificial gate material after the spacer is removed from the first and second openings, wherein the fill layer is formed atop the first and second contacts;
forming a plurality of trenches through the device structure, wherein at least one trench of the plurality of trenches is formed between the first shielding layer and the second shielding layer; and
forming a gate structure within the at least one trench of the plurality of trenches.

16. The method of claim 15, wherein forming the first and second shielding layers comprises performing an ion implant into the well, the epitaxial layer, and the source layer, wherein the ion implant is delivered through the plurality of openings of the sacrificial gate material layer.

17. The method of claim 15, further comprising:
providing a mask over the device structure;
forming an opening though the mask; and
removing a portion of the sacrificial gate material layer exposed through the opening of the mask without removing the fill layer, wherein the plurality of trenches are formed through the well, the epitaxial layer, and the source layer after the portion of the sacrificial gate material is removed.

18. The method of claim 15, further comprising:
recessing the first and second contacts after the gate structure is formed; and
forming a metal fill over the device structure after the first and second contacts are recessed.

* * * * *